(12) United States Patent
Song

(10) Patent No.: US 8,749,444 B2
(45) Date of Patent: Jun. 10, 2014

(54) IMPEDANCE MATCHING METHOD, IMPEDANCE MATCHING APPARATUS FOR THE SAME, AND RECORD MEDIUM

(75) Inventor: Ju Young Song, Seoul (KR)

(73) Assignee: LG Innotex Co., Ltd., Seoul (KR)

( * ) Notice: Subject to any disclaimer, the term of this patent is extended or adjusted under 35 U.S.C. 154(b) by 358 days.

(21) Appl. No.: 13/197,477

(22) Filed: Aug. 3, 2011

(65) Prior Publication Data

US 2012/0038524 A1 Feb. 16, 2012

(30) Foreign Application Priority Data

Aug. 11, 2010 (KR) .......................... 10-2010-0077135

(51) Int. Cl.
*H01Q 1/50* (2006.01)
(52) U.S. Cl.
USPC .......................................... 343/860; 343/850
(58) Field of Classification Search
USPC .................... 343/703, 850, 860, 861
See application file for complete search history.

(56) References Cited

U.S. PATENT DOCUMENTS

| | | | | | |
|---|---|---|---|---|---|
| 3,281,721 | A | * | 10/1966 | Clark | 333/17.1 |
| 3,818,480 | A | * | 6/1974 | West | 342/435 |
| 5,225,847 | A | * | 7/1993 | Roberts et al. | 343/745 |
| 6,862,432 | B1 | * | 3/2005 | Kim | 455/80 |
| 7,109,944 | B2 | * | 9/2006 | Sato et al. | 343/860 |
| 7,592,961 | B2 | * | 9/2009 | Thober et al. | 343/745 |
| 7,982,683 | B2 | * | 7/2011 | Peyla et al. | 343/860 |

* cited by examiner

*Primary Examiner* — Tho G Phan
(74) *Attorney, Agent, or Firm* — Saliwanchik, Lloyd & Eisenschenk

(57) ABSTRACT

Disclosed are an impedance matching method, an impedance matching apparatus for the same, and a record medium. The impedance matching apparatus includes an impedance matching part connected to an antenna to transmit/receive a radio wave and including at least one variable capacitor, a detector to detect transmit power and reflected power reflected by the antenna, and a controller to set a first searching region within a whole variation range of the variable capacitor, to detect an optimal impedance matching point within the first searching region by using at least one of the transmit power and the reflected power, and to set a next searching region about the optimal impedance matching point to search for a final impedance matching point within the whole variation range of the variable capacitor.

20 Claims, 10 Drawing Sheets

IMPEDANCE MATCHING METHOD, IMPEDANCE MATCHING APPARATUS FOR THE SAME, AND RECORD MEDIUM

CROSS-REFERENCE TO RELATED APPLICATION

This application claims the benefit under 35 U.S.C. §119 of Korean Patent Application No. 10-2010-0077135, filed on Aug. 11, 2010, which is hereby incorporated by reference in its entirety.

BACKGROUND

An antenna circuit of a mobile communication terminal allows an antenna to transmit or receive predetermined radio signals.

In order to optimize the transmit/receive radiation performance of the antenna, impedance matching must be exactly performed.

Therefore, the antenna circuit includes capacitors and inductors, and the impedance of the antenna is matched in the optimal status by adjusting values of the capacitors and the inductors.

In general, the impedance matching of the antenna is achieved in a state that the mobile communication terminal is positioned in a free space.

Meanwhile, the mobile communication terminal may be used by a user in a state that the user handholds the body of the mobile communication terminal and adheres a speaker to the ear of the user due to the mechanical characteristic of the mobile communication terminal, or may be used by the user through an ear-phone in a state that the body of the mobile communication terminal is put into a pocket or a bag of the user.

As the user uses the mobile communication terminal by gripping the mobile communication terminal with the hand of the user and closely touching the speaker to the ear of the user, or as the user uses the mobile communication terminal put into the pocket or the bag, the conditions for the impedance matching of the antenna may vary, so that the transmit/receive radiation performance of the antenna subject to impedance matching in the free space may be degraded.

Therefore, the mobile communication terminal employs an adaptive tuning antenna circuit to automatically adjust the impedance of the antenna when the conditions for the impedance matching of the antenna vary, so that the antenna has the optimal transmit/receive radiation performance.

The adaptive tuning antenna circuit must detect the impedance variation of the antenna to maintain the transmit/receive radiation performance of the antenna in the optimal state.

To this end, the adaptive tuning antenna circuit includes a coupler to detect reflected power and forward power output from the coupler, and to change the capacitance of a variable capacitor according to the reflected power and the forward power, so that impedance matching can be performed.

According to the related art, as shown in FIG. 1, after sequentially scanning the whole variable region of the variable capacitor, a point representing the best RF performance is selected and adapted, thereby performing impedance matching.

However, if the whole region of the variable capacitor is scanned as described above, a point representing the inferior RF performance is inevitably scanned, so that the transmit/receive radiation performance may be degraded.

BRIEF SUMMARY

The embodiment performs impedance matching by searching for the optimal capacitance value of a variable capacitor within a short period of time.

The technical objects of the present embodiment are not limited to the above object, and other technical objects will be clearly understood by those skilled in the art to which the embodiment suggested in the following description pertains.

According to the embodiment, there is provided an impedance matching apparatus including an impedance matching part connected to an antenna to transmit/receive a radio wave and including at least one variable capacitor, a detector to detect transmit power and reflected power reflected by the antenna, and a controller to set a first searching region within a whole variation range of the variable capacitor, to detect an optimal impedance matching point within the first searching region by using at least one of the transmit power and the reflected power, and to set a next searching region about the optimal impedance matching point to search for a final impedance matching point within the whole variation range of the variable capacitor.

According to the embodiment, there is provided an impedance matching method of an impedance matching apparatus including a variable capacitor connected to an antenna. The impedance matching method includes setting a first searching region about a specific point within a whole variation range of the variable capacitor, detecting transmit power and reflected power with respect to each point contained in the first searching region, searching for an optimal impedance matching point within the first searching region by using the transmit power and the reflected power, and setting a next searching region about the impedance matching point to search for a final impedance matching point within the whole variation range.

DETAILED DESCRIPTION

Detailed description about well known functions or configurations may make the subject matter of the disclosure unclear. Accordingly, hereinafter, description will be made regarding only essential components directly related to the technical scope of the disclosure. In addition, terminologies to be described are defined based on functions of components according to the embodiment, and may have meanings varying according to the intentions of a user or an operator and customers. Accordingly, the terminologies should be defined based on the whole context throughout the present specification.

The embodiment provides a method for processing impedance matching at a high speed in an impedance matching apparatus.

Hereinafter, the embodiment will be described with reference to accompanying drawings.

Figure 1:
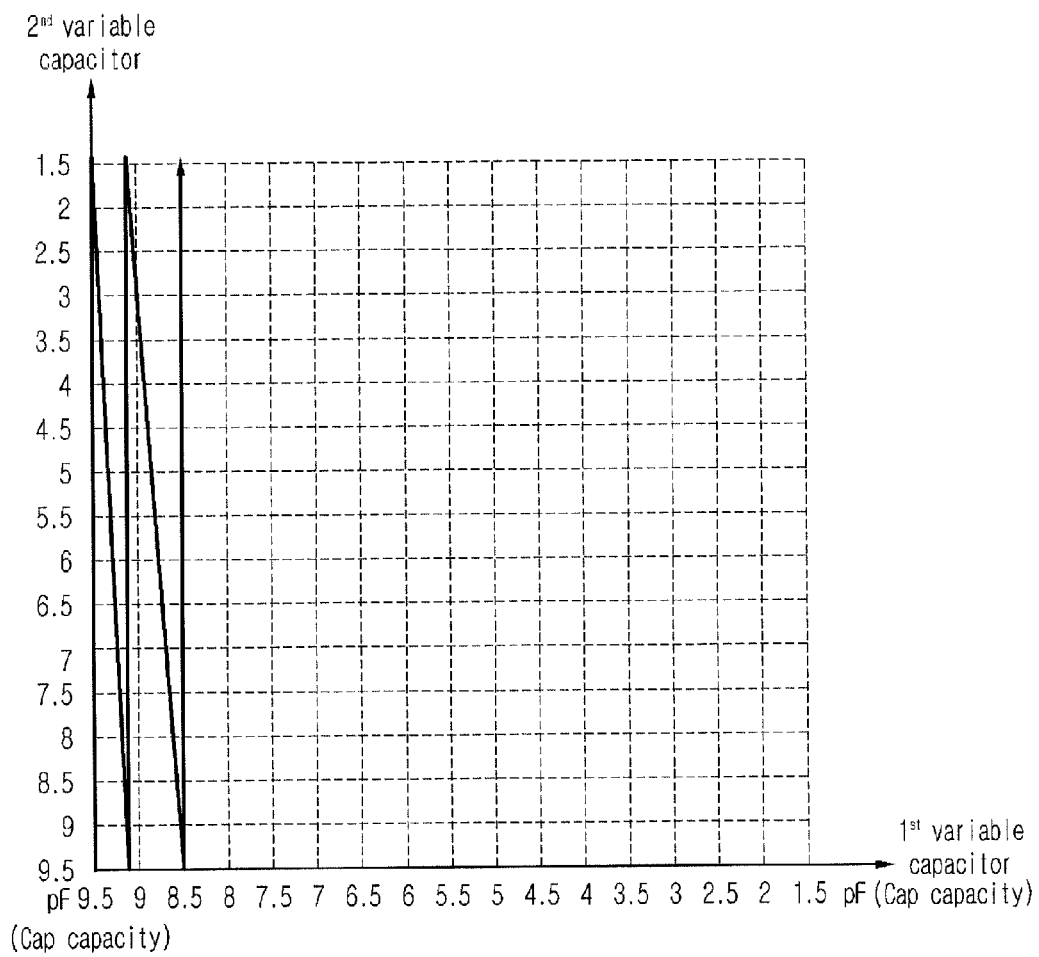
FIG. 1 is a graph showing a method for searching for a capacitance value according to the related art.
Figure 2:
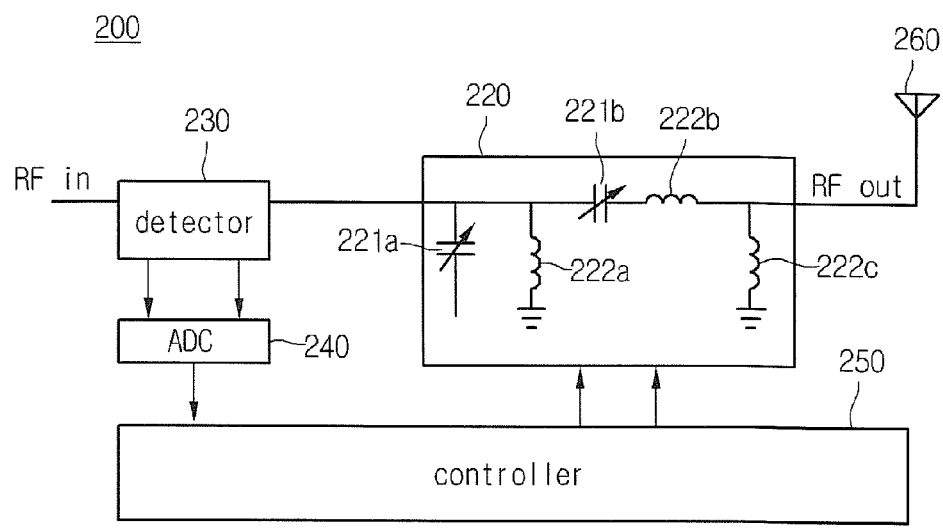
FIG. 2 is a circuit diagram showing an impedance matching apparatus according to the embodiment.

FIG. 2 is a circuit diagram showing the structure of an impedance matching apparatus 200 according to the embodiment, and FIGS. 3 to 9 are views showing a method for searching for a capacitance value according to the embodiment.

Referring to FIG. 2, the impedance matching apparatus 200 includes an impedance matching part 220 including a parallel capacitor 221a connected to an antenna, which transmits or receives a radio wave, in parallel, a series-capacitor 221b connected to the antenna in series, and inductors 222a, 222b, and 222c, a detector 230 to detect transmit power and power reflected from an antenna stage, an analogue/digital converter ADC 240 to convert an analog signal detected by the detector 230 into a digital signal, a controller 250 to create control signals of the variable capacitors 221a and 221b based on the transmit power and the reflected power received therein from the ADC 240 and to transmit the control signals to the impedance matching part 220, and an antenna 260 to transmit/receive a radio wave.

The impedance matching part 220 may include a plurality of variable capacitors 221a and 221b and a plurality of fixed inductors 222a, 222b, and 222c. The number of the wires of the variable capacitors 221a and 221b and the fixing inductors 222a, 222b, and 222c and the number of the above elements may vary according to embodiments. The variable capacitors 221a and 221b and the fixing inductors 222a, 222b, and 222c form impedance of an appliance equipped with the impedance matching apparatus 200.

The capacitance values of the variable capacitors 221a and 221b vary depending on the DC voltage applied thereto from the controller 250, and the intensity of the reflected power for a transmit signal vary depending on the changed capacitance value of the variable capacitors 221a and 221b. In this case, if the intensity of the reflected power is increased, impedance matching is not achieved. If the intensity of the reflected power is reduced, impedance matching is excellently achieved. In other words, the reflective coefficient is calculated by using the difference (Return Loss, hereinafter, referred to as RL) between the transmit power and the reflected power. As the RL is increased, the impedance matching is excellently achieved. As the RL is reduced, the impedance matching is not achieved.

Meanwhile, although the variable capacitors 221a and 221b include one parallel capacitor 221a and one series-capacitor 221b according to the present embodiment, the embodiments are limited thereto. In other words, only the parallel capacitor 221a or only the series-capacitor 221b may be provided, or at least three variable capacitors may be provided.

The detector 230 measures the intensity of the transmit power and the intensity of the reflected power obtained by reflecting a signal input to the impedance matching apparatus 200 by the stage of the antenna 260. In this case, the detector 230 may additionally include a directional coupler.

In other words, the detector 230 is connected to one end of the directional coupler to detect the intensity of the transmit power, and is connected to an opposite end of the directional coupler to detect the intensity of the reflected power.

The controller 250 applies control signals to the variable capacitors 221a and 221b based on the transmit power and the reflected power to change the impedance value of the impedance matching part 220, thereby performing impedance matching.

However, according to the impedance matching algorithms according to the related art, since the controller 250 sequentially changes capacitance values of the variable capacitors 221a and 221b at a predetermined interval while searching for points satisfying preset conditions as much as possible, too much time is taken and a great amount of power is consumed. The details of the conditions will be described later.

In addition, the controller 250 searches for the optimal capacitance value, that is, the tuned capacitance value while applying the control signal of the variable capacitors 221a and 221b to change the capacitance values. In this case, the variation range of the capacitance values of the variable capacitors 221a and 221b is an issue.

Therefore, the present embodiments provide an impedance matching algorithm effective more than the impedance matching algorithm according to the related art. According to the embodiment, the impedance matching algorithm includes a greedy algorithm.

Figure 3:
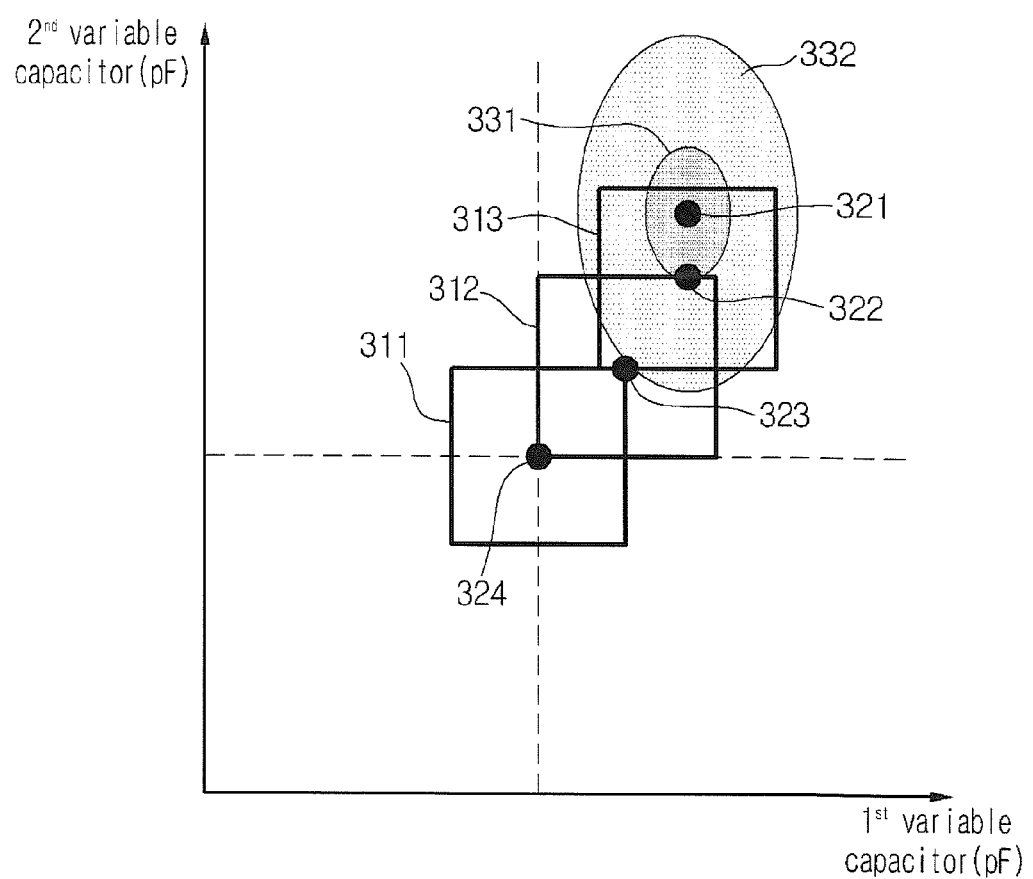
FIGS. 3 to 9 are views showing a method for searching for a capacitance value according to the embodiment.

FIG. 3 is a view showing an overall impedance matching scheme according to the embodiment.

Referring to FIG. 3, an x axis represents the capacitance value of the first variable capacitor and a y axis represents the capacitance value of the second variable capacitor.

When the impedance matching apparatus 200 performs the impedance matching, the impedance matching apparatus 200 sets a first window 311 (searching region) about a point 324 corresponding to an intermediate value of the variation range of the first and second variable capacitor.

The optimal point (the optimal impedance matching point) is detected within the first window 311 by performing a searching operation for the first window 311. The optimal point is affected by the intensity of the reflected power. As the intensity of the reflected power is reduced, impedance matching is excellently achieved. Accordingly, the detected point may be the optimal point. In other words, the optimal point is a point satisfying at least one condition. According to the condition, the optimal point must represent at least one of the maximum intensity of the transmit power, the maximum difference between the transmit power and the reflected power, the minimum intensity of the reflected power, and the maximum ratio of the reflected power to the transmit power. In addition, a window refers to a region in which a searching operation is performed for impedance matching, and the searching operation is to sequentially apply the values of the first and second variable capacitors corresponding to the window to detect the intensities of the transmit power and the reflected power.

In addition, hereinafter, the optimal impedance matching point and the final impedance matching point will be described. The optimal impedance matching point is a point in which the condition is satisfied within the related searching region as much as possible, and the final impedance matching point is a point in which the condition is satisfied as much as possible within the whole variation range of the variable capacitor. In other words, one of the optimal impedance matching points searched within the searching regions is the final impedance matching point.

The first window 311 may be set in the shape of a square. The length of one side of the square, that is, the variation range of the variable capacitor may vary according to the embodiment.

In addition, the first window 311 is divided into a plurality of sections, that is, at one of nine sections (3×3), 16 sections (4×4), and 25 sections (5×5), and the length of one section may vary according to embodiments.

Meanwhile, in the graph of FIG. 3, the final impedance matching point is assumed as an M point 321, in which the final impedance matching point must represent at least one of the maximum intensity of the transmit power, the maximum difference between the transmit power and the reflected power, the minimum intensity of the reflected power, and the maximum ratio of the reflected power to the transmit power within the all variation range of the first and second variable capacitors. In addition, a region 331 having the great satisfaction degree for the condition and a region 322 having a less satisfaction degree for the condition may be provided in the shape of a contour line about the M point 321.

The satisfaction degree for the condition is reduced as the distance from the M point 321 is increased. Accordingly, when the searching operation is performed within the first window 311, the satisfaction degree for the condition is maximized at the first point 323 closest to the M point 321 within the first window 311. In other words, the point representing the maximum intensity of the transmit power, the maximum difference between the transmit power and the reflected power, the minimum intensity of the reflected power, and the maximum ratio of the reflected power to the transmit power within the first window 311 is the first point 323 closest to the M point 321.

If the optimal point 323 is determined within the first window 311, a second window 312 is set about the optimal point 323. In this case, the second window 312 has the shape of a square identical to the shape of the first window 311 as shown in FIG. 3. In addition, the second window 312 is positioned toward the M point 321 with respect to the first window 311.

Accordingly, the impedance matching apparatus 200 performs a searching operation with respect to the second window 312 to determine the optimal point 322 within the second window 312.

Thereafter, a third window 313 is set about the optimal point 322 of the second window 312 toward the M point 321, and the search operation is performed with respect to the third window 313. In this case, the third window 313 may be set in the shape of a square the same as that of the first window 311 as shown in FIG. 3.

The third window 313 includes the optimal impedance matching point 321, so that the satisfaction degree for the condition is increased and then reduced within the third window 313. In other words, one point, in which the capacitance value of the variable capacitor is changed in one direction and the increase and the decrease in the satisfaction degree for the condition is changed, can be found, and the point is the final impedance matching point 321.

If the final impedance matching point 321 is determined, the impedance matching apparatus 200 performs the impedance matching with the capacitance value of the variable capacitor corresponding to the final impedance matching point 321.

Although the first to third windows 311 to 313 are set in the shape of a square according to the present embodiment, the embodiments are limited thereto. According to another embodiment, the windows may have various shapes.

Hereinafter, a scheme of searching for the optimal matching point 321 will be described in more detail. FIG. 10 is a flowchart showing the impedance matching method of the impedance matching apparatus according to the embodiment. Hereinafter, the impedance matching method of FIG. 10 will be described in more detail with reference to FIGS. 4 to 9.

Figure 4:
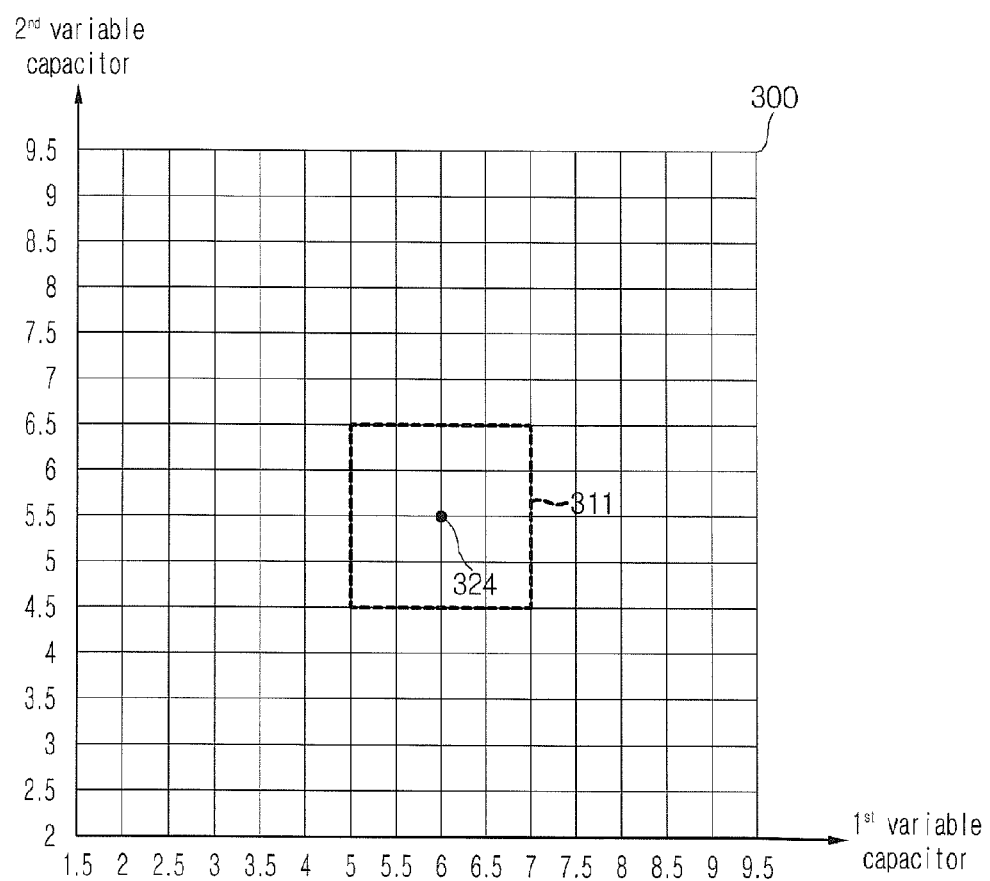

As shown in FIG. 4, an initial searching region (the first window) 311 is set in the shape of a square with a predetermined size about the point 324 representing the intermediate value between the first and second capacitors (step S100). Although FIG. 4 shows that the first window 311 is set in the shape of a 4×4 square, this is for the illustrative purpose. According to another embodiment, the length of one side of the square may be increased or decreased.

Thereafter, the controller 250 performs a searching operation of sequentially applying first and second capacitance values corresponding to points contained in the first window 311 and detecting the transmit power and the reflected power varying according to the first and second capacitance values (step S110).

Figure 5:
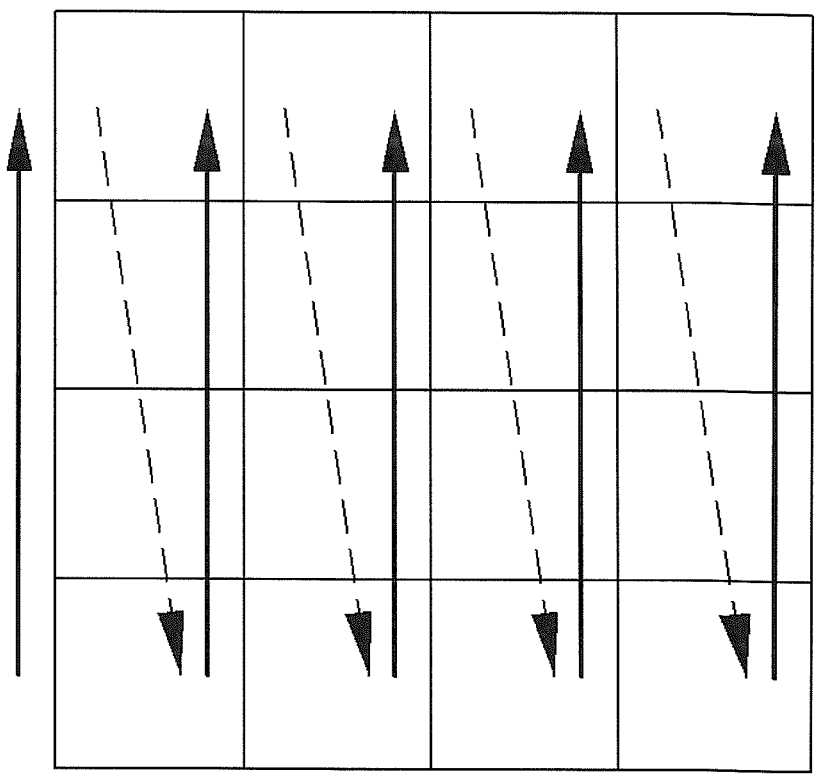

In this case, as shown in FIG. 5, the controller 250 sequentially performs the searching operating from the bottom to the top while moving from the left sections to the right sections to search for a point representing the maximum intensity of the transmit power, a point representing the maximum difference between the transmit power and the reflected power, a point representing the minimum intensity of the reflected power, and a point representing the maximum ratio of the reflected power to the transmit power within the first window 311. In other words, as shown in FIG. 5, the optimal point is searched from the left-lowermost section to the right-uppermost section within the first window 311.

If the first point 323 satisfying the conditions is detected within the first window 311, the controller 250 checks the position of the first point 323 (steps S120 and S130). In other words, the controller 250 checks if the first point 323 is positioned at an outer point of the first window 311, or if the first point 323 is positioned at a point other than the outer point of the window 311, that is, positioned inside the first window 311. According to the embodiment, in the following description, it is assumed that the first point 323 is positioned at the outer point of the first window 311.

Figure 6:
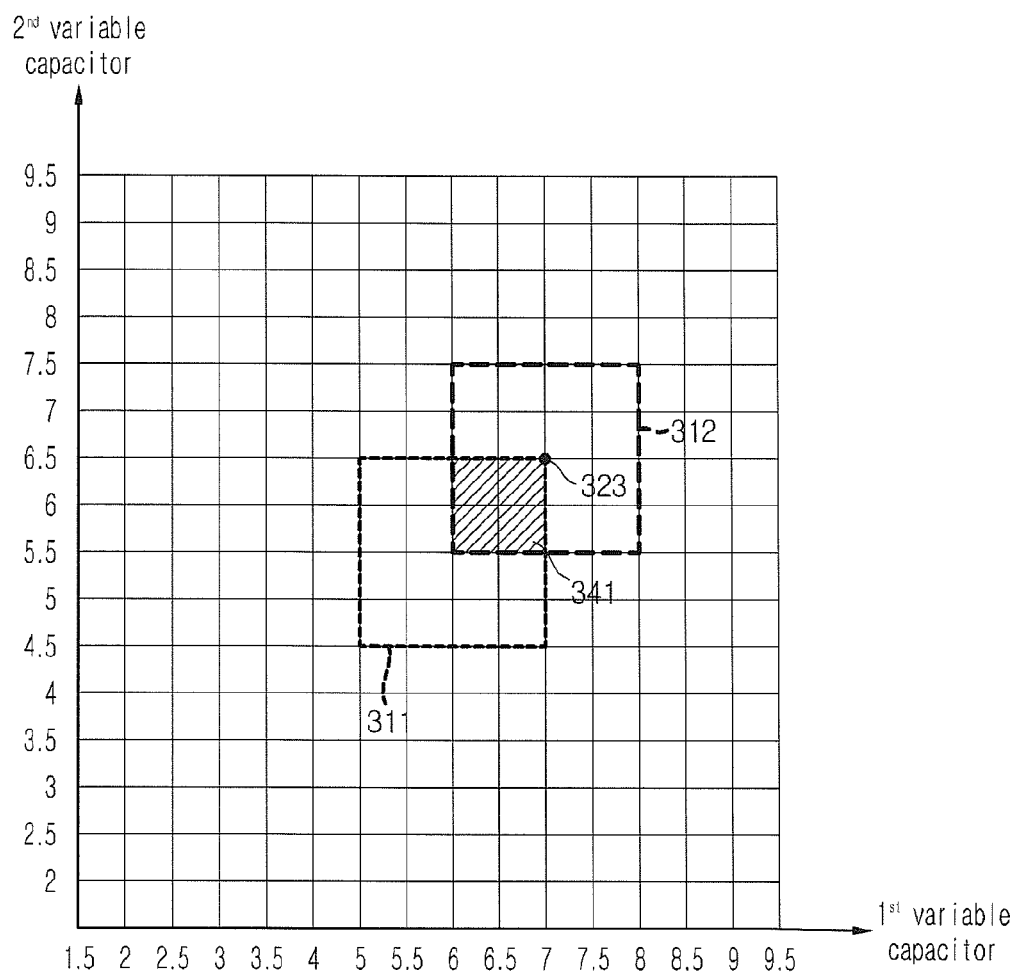

As shown in FIG. 6, the controller 250 sets the second window 312, which has the same size as that of the first window 311, about the first point 323 if the first point 323 is positioned at the outer point of the first window 311 (step S140). Accordingly, the steps S110 to S130 are sequentially performed with respect to the second window 312, so that the searching operation for the second window 312 is continuously performed.

In this case, since the second window 312 is set about one point contained in the first window 311, a first overlap region 341 with the first window 311 exists in the second window 312.

Therefore, the controller 250 performs the searching operation only with respect to remaining points other than the points contained in the first overlap region 341 among points contained in the second window 312.

Figure 7:
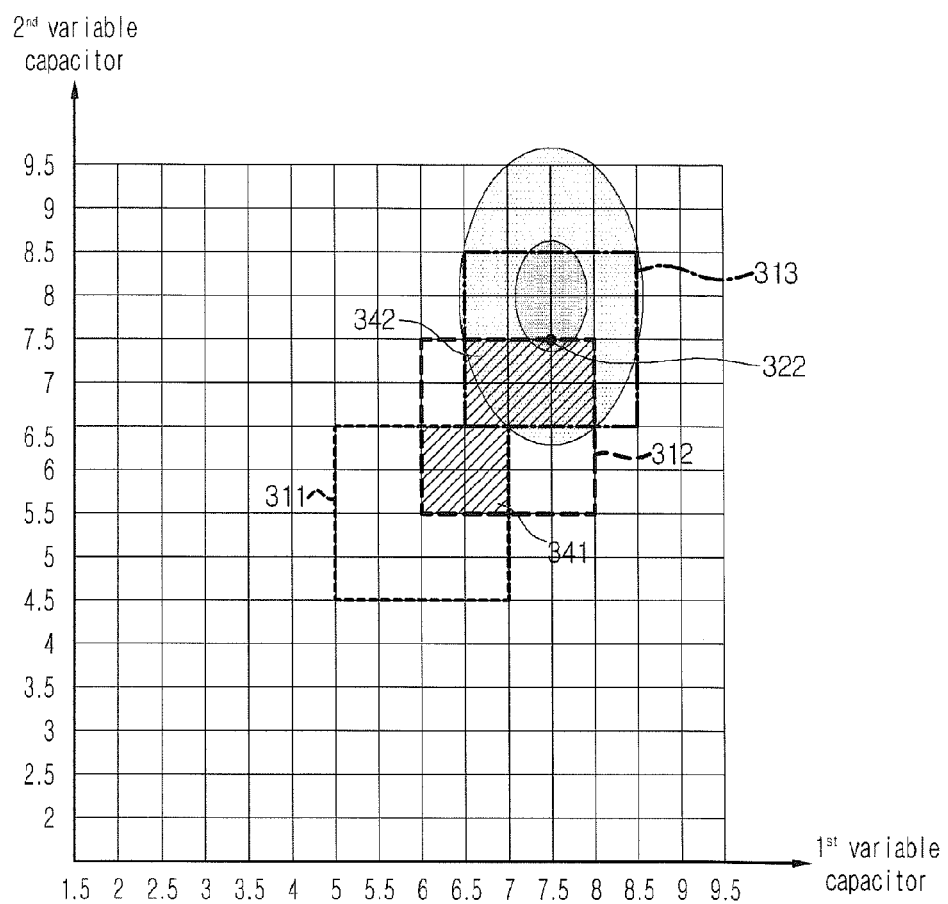

Thereafter, as shown in FIG. 7, the controller 250 detects a second point 322, which satisfies the condition as much as possible, based on the transmit power and the reflection power obtained when the capacitance values corresponding to the points contained in the second window 321 are applied.

Thereafter, since the second point 322 is positioned at the outer point of the second window 312, the controller 250 sets a third window 313, which is a next searching region, about the second point 322.

In this case, since the third window 313 is set about one point contained in the second window 312, a second overlap region 342 with the second window 312 exists in the third window 313.

Therefore, the controller 250 performs the searching operation only with respect to remaining points other than the points contained in the second overlap region 341 among points of the third window 313.

Figure 8:
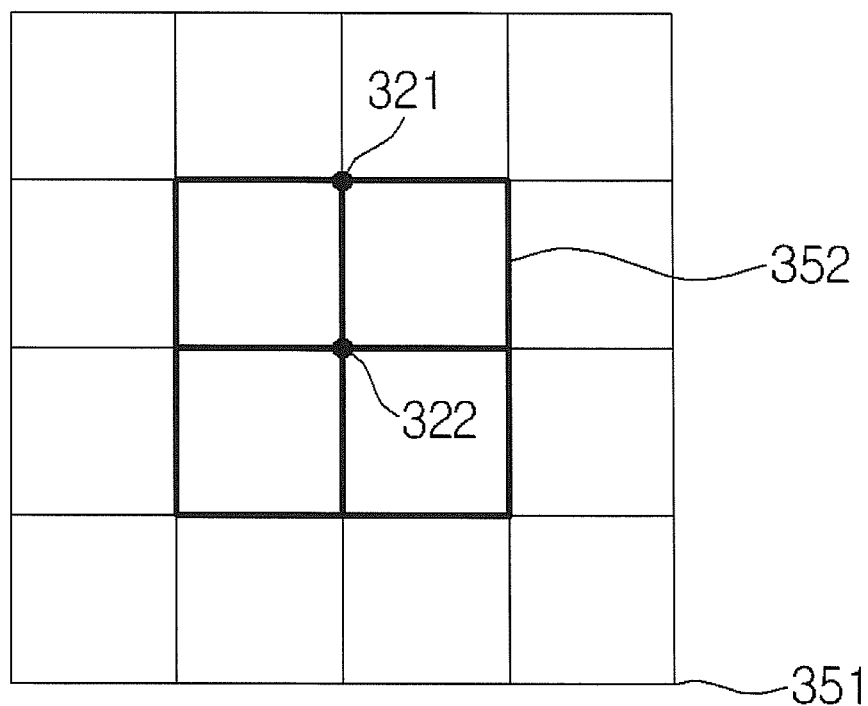

FIG. 8 is a view showing the third window 313 in more detail.

Referring to FIG. 8, the controller 250 detects a point, which satisfies the condition as much as possible, within the third window 313.

In this case, if the third point 321 satisfying the condition as much as possible within the third window 313 is detected, the controller 250 checks if the third point 321 is positioned at the outer point of the third window 313, or positioned inside the window 313.

In other words, as shown in FIG. 8, an outer point 351 and an inner point 352 exist within the third window 313, and it is checked if the third point 321 is positioned at the outer point 351 or the inner point 352.

If the third point 321 exists on the outer point 351 within the third window 313, the controller 250 sets a next searching window about the third point 321.

However, since the third point 321 exists on the inner point 352 within the third window 313, the controller 250 determines the third point 321 as the final point (the final impedance matching point) for the impedance matching, the first and second capacitance values corresponding to the final point are applied to perform the impedance matching (step 150). In other words, since the satisfaction degree for the condition is increased and then reduced within the third window 313, the final point for the impedance matching exists within the third window 313.

Meanwhile, the final impedance matching point is determined according to if the point satisfying the conditions as much as possible is positioned at the outer point of the window. According to another embodiment, the final impedance matching point may be determined about a preset reference value.

In other words, after the difference between the transmit power and the reflected power when the impedance is exactly matched is determined as a reference value, if a point having a value greater than or equal to the reference value is detected in the process of the searching operation, the detected point may be determined as the final point. In addition, according to the present embodiment, after determining reference values for the transmit power value, the reflected power value, and the ratio between the transmit power and the reflected power other than the difference value, the final point can be determined according to the reference values.

Figure 9:
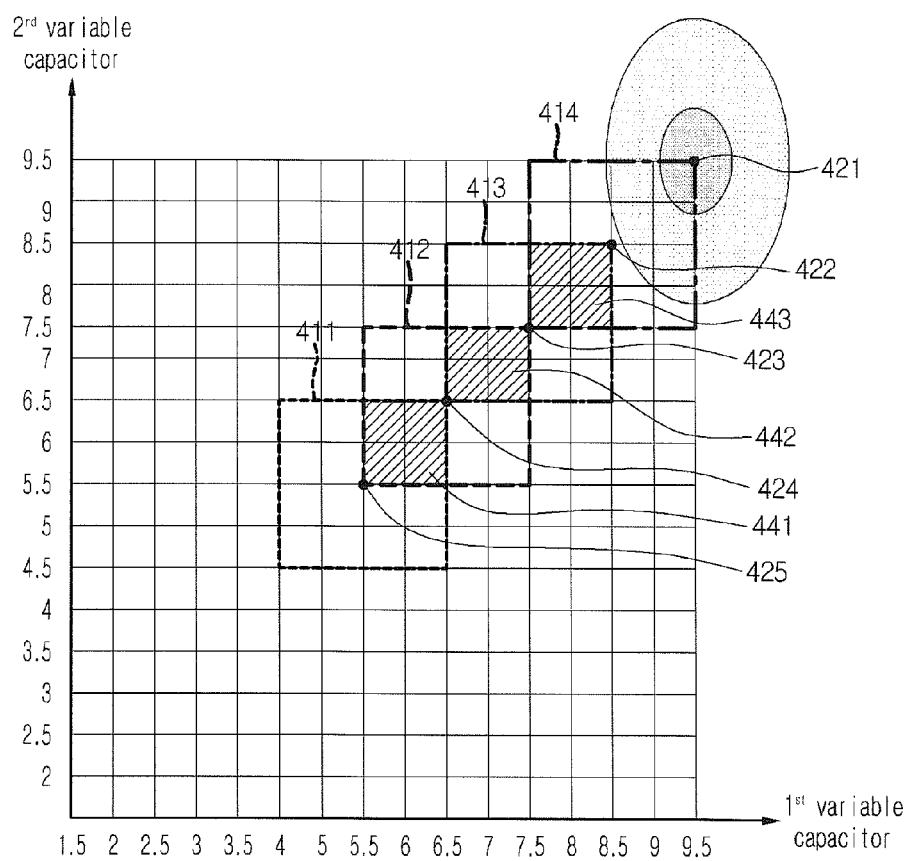
Figure 10:
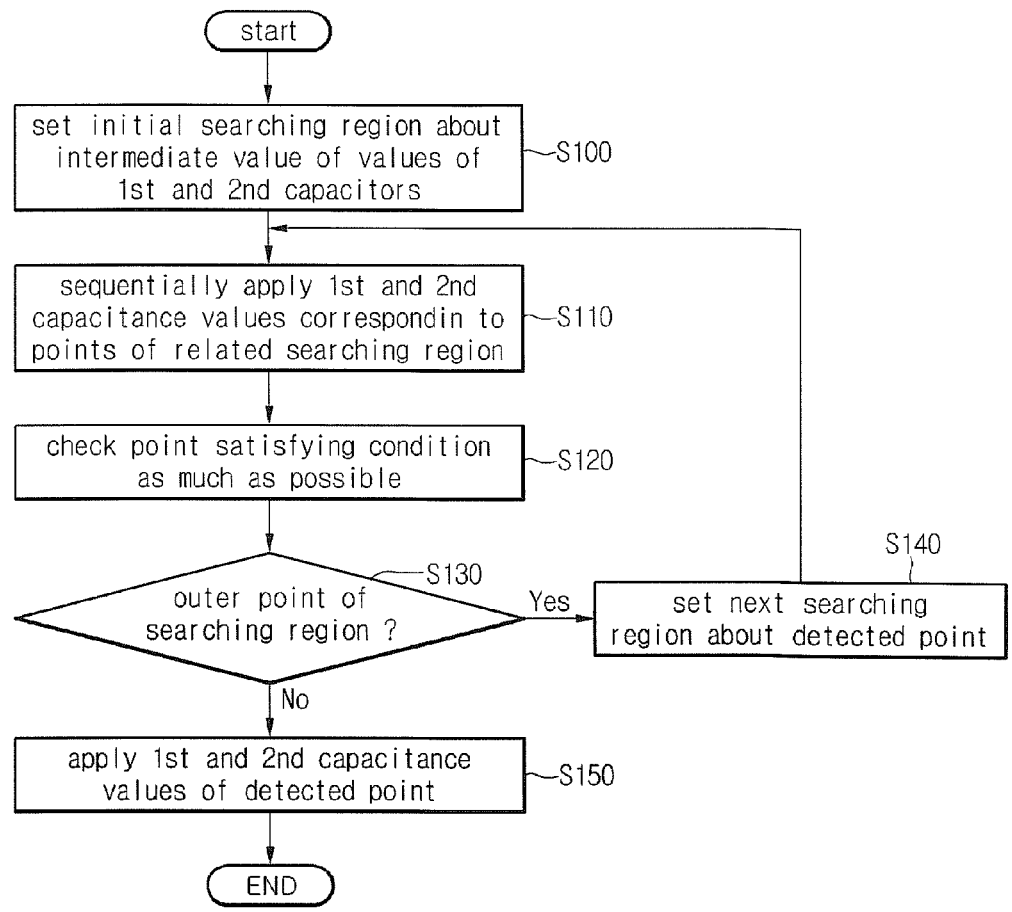
FIG. 10 is a flowchart showing an impedance matching method of an impedance matching apparatus according to the embodiment step by step.

FIG. 9 is a view that the final impedance matching point is positioned at the outermost point of the variation range of the first and second capacitors.

The controller 250 sets a first window 411 about a point 425 having the intermediate value between values of the first and second capacitors, and detects a first point 424 satisfying the condition as much as possible within the first window 411.

Thereafter, the controller 250 sets the second window 412 about the first point 424, and detects the second point 423 satisfying the condition as much as possible within the second window 412.

In this case, the controller 250 performs the searching operation only with respect to remaining regions except for the first overlap region 441 with the first window 411.

Thereafter, the controller 250 sets a third window 413 about the second point 423 after the second point 423 has been detected. In addition, the controller 250 detects a third point 422 satisfying the condition as much as possible within the third window 413. In this case, the controller 250 omits the searching operation for the second overlap region 442 overlapping with the second window 412 provided in the third window 413.

In addition, the controller 250 sets a fourth window 414 about the third point 422 and detects the fourth point 421 satisfying the conditions as much as possible within the fourth window 414. In this case, similarly to the above, the searching operation is not performed with respect to the third overlap region 443.

In this case, since the first, second, and third points 424, 423, and 422 are positioned at outer points of the related windows, the controller 250 sets a next searching region so that the searching operation can be continuously performed.

However, although the fourth point 421 is positioned at the outer point of the related window, the fourth point 421 is positioned at the outermost point of the whole variation range of the first and second capacitors. Accordingly, the fourth point 421 is determined as the final point for the impedance matching.

Meanwhile, the impedance matching method according to the embodiment can be realized by using codes readable by a processor installed in a computer from record media readable by the processor. The record media readable by the processor include all kinds of recording devices to record data readable by the processor. The record media readable by the processor include an ROM, an RAM, a CD-ROM, a magnetic tape, a floppy disc, and an optical data storing device. In addition, the record media readable by the processor may be realized in the form of a carrier wave such as transmission over the Internet. In addition, the record media readable by the processor are distributed into computer systems connected to each other over a network to store and execute codes readable by the processor through a distribution scheme.

As described above, according to another embodiment, the searching operation can be performed only with respect to ¼ of a conventional region within a variation range of the first and second capacitors. Accordingly, signal degradation caused by abnormal capacitance values can be prevented and the optimal impedance matching can be performed within the short period of time.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An impedance matching apparatus comprising:
an impedance matching part connected to an antenna to transmit/receive a radio wave and including at least one variable capacitor;
a detector to detect transmit power and reflected power reflected by the antenna; and
a controller to set a first searching region within a whole variation range of the variable capacitor, to detect an optimal impedance matching point within the first searching region by using at least one of the transmit power and the reflected power, and to set a next searching region about the optimal impedance matching point to search for a final impedance matching point within the whole variation range of the variable capacitor.

2. The impedance matching apparatus of claim 1, wherein the impedance matching point includes at least one of a point representing maximum transmit power, a point representing a maximum difference between the transmit power and the reflected power, and a point representing a maximum ratio of the transmit power to the reflected power.

3. The impedance matching apparatus of claim 1, wherein the first searching region is set in a square shape having a predetermined size about an intermediate capacitance value within the whole variation range of the variable capacitor.

4. The impedance matching apparatus of claim 1, wherein the controller performs a searching operation with respect to a remaining region except for a region, which overlaps with a previously set searching region, within the next searching region.

5. The impedance matching apparatus of claim 1, wherein the controller determines the impedance matching point as the final impedance matching point if the impedance matching point is positioned at inner points other than outer points in a present searching region.

6. The impedance matching apparatus of claim 5, wherein the controller continuously performs a searching operation by setting the next searching region about the impedance matching point if the impedance matching point is positioned at the outer point of the present searching region.

7. The impedance matching apparatus of claim 1, wherein the detector includes a directional coupler.

8. The impedance matching apparatus of claim 1, wherein the impedance matching part comprises:
a first variable capacitor connected to the antenna in series;
a second variable capacitor connected to the antenna in parallel; and
at least one inductor connected to the first and second variable capacitors.

9. The impedance matching apparatus of claim 8, wherein the controller performs impedance matching by applying first and second capacitance values corresponding to the final impedance matching point to the first and second variable capacitors, respectively.

10. An impedance matching method of an impedance matching apparatus including a variable capacitor connected to an antenna, the impedance matching method comprising:
setting a first searching region about a specific point within a whole variation range of the variable capacitor;
detecting transmit power and reflected power with respect to each point contained in the first searching region;
searching for an optimal impedance matching point within the first searching region by using the transmit power and the reflected power; and
setting a next searching region about the impedance matching point to search for a final impedance matching point within the whole variation range.

11. The impedance matching method of claim 10, wherein the searching for the optimal impedance matching point comprises searching for one of a point representing maximum transmit power, a point representing a maximum difference between the transmit power and the reflected power, and a point representing a maximum ratio of the transmit power to the reflected power within the first searching region.

12. The impedance matching method of claim 10, wherein the variable capacitor includes first and second variable capacitors, and the first searching region is set in a square shape having a predetermined size about an intermediate capacitance value of the first and second variable capacitors.

13. The impedance matching method of claim 12, wherein the next searching region includes remaining regions except for a region overlapping with a previous searching region within a region which is set in a square shape having a predetermined size about the impedance matching point.

14. The impedance matching method of claim 10, wherein the searching for the final impedance matching point comprises:
determining the impedance matching point as the final impedance matching point if the impedance matching point is positioned at inner points other than outer points in a present searching region; and
setting the next searching region about the impedance matching point to search for the final impedance matching point if the impedance matching point is positioned at the outer points of the present searching region.

15. The impedance matching method of claim 10, further comprising performing impedance matching by applying capacitance values corresponding to the final impedance matching point if the final impedance matching point is detected.

16. A non-transitory computer-readable record medium storing an impedance matching method and recording a program to execute the impedance matching method of an antenna on a computer, wherein the impedance matching method comprises:
setting a first searching region about a specific point within a whole variation range of a variable capacitor;
detecting transmit power and reflected power corresponding to points contained in the first searching region;
searching for an optimal impedance matching point within the first searching region by using the transmit power and the reflected power; and
setting a next searching region about the impedance matching point to search for a final impedance matching point within the whole variation range.

17. The non-transitory computer-readable record medium of claim 16, wherein the searching for the optimal impedance matching point comprises searching for one of a point representing maximum transmit power, a point representing a maximum difference between the transmit power and the reflected power, and a point representing a maximum ratio of the transmit power to the reflected power within the first searching region.

18. The non-transitory computer-readable record medium of claim 16, wherein the variable capacitor includes first and second variable capacitors, and the first searching region is set in a square shape having a predetermined size about an intermediate capacitance value of the first and second variable capacitors.

19. The non-transitory computer-readable record medium of claim 16, wherein the searching for the final impedance matching point comprises:
determining the impedance matching point as the final impedance matching point if the impedance matching point is positioned at inner points other than outer points in a present searching region; and
setting the next searching region about the impedance matching point to search for the final impedance matching point if the impedance matching point is positioned at the outer points of the present searching region.

20. The non-transitory computer-readable record medium of claim 16, wherein the next searching region includes a remaining region except for a region overlapping with a previous searching region within a region which is set in a square shape with a predetermined size about the impedance matching point.

* * * * *